United States Patent
Van Camp

(10) Patent No.: US 7,352,014 B2
(45) Date of Patent: Apr. 1, 2008

(54) SEMICONDUCTOR DEVICE BASED ON A SCR

(75) Inventor: Benjamin Van Camp, Brugge (BE)

(73) Assignees: Sarnoff Corporation, Princeton, NJ (US); Sarnoff Europe (BE)

(*) Notice: Subject to any disclaimer, the term of this patent is extended or adjusted under 35 U.S.C. 154(b) by 0 days.

(21) Appl. No.: 11/395,464

(22) Filed: Mar. 30, 2006

(65) Prior Publication Data

US 2006/0262471 A1   Nov. 23, 2006

Related U.S. Application Data

(60) Provisional application No. 60/666,476, filed on Mar. 30, 2005.

(51) Int. Cl.
*H01L 23/62* (2006.01)

(52) U.S. Cl. ............... 257/173; 257/355; 257/E29.181
(58) Field of Classification Search ........ 257/355–363, 257/173, E29.181; 361/56, 91.1
See application file for complete search history.

(56) References Cited

U.S. PATENT DOCUMENTS

| 5,844,280 | A* | 12/1998 | Kim ................... 257/355 |
| 6,268,992 | B1* | 7/2001 | Lee et al. ............ 361/111 |
| 2003/0035257 | A1* | 2/2003 | Chen ................... 361/56 |
| 2004/0243949 | A1* | 12/2004 | Wang et al. ............ 716/4 |
| 2005/0242400 | A1* | 11/2005 | Cheng et al. ........ 257/355 |
| 2005/0269641 | A1* | 12/2005 | Lai et al. ............ 257/355 |
| 2006/0050453 | A1* | 3/2006 | Duvvury et al. ....... 361/56 |

* cited by examiner

*Primary Examiner*—Minh-Loan T Tran
(74) *Attorney, Agent, or Firm*—Lowenstein Sandler PC

(57) ABSTRACT

The present invention provides a semiconductor structure device having a first and a second semiconductor devices with a silicon controlled rectifier (SCR) formed between the two devices with advantages to couple the devices to provide more design flexibility and enhanced triggering in order to improve the ESD performance of the device.

18 Claims, 7 Drawing Sheets

FIG. 4B
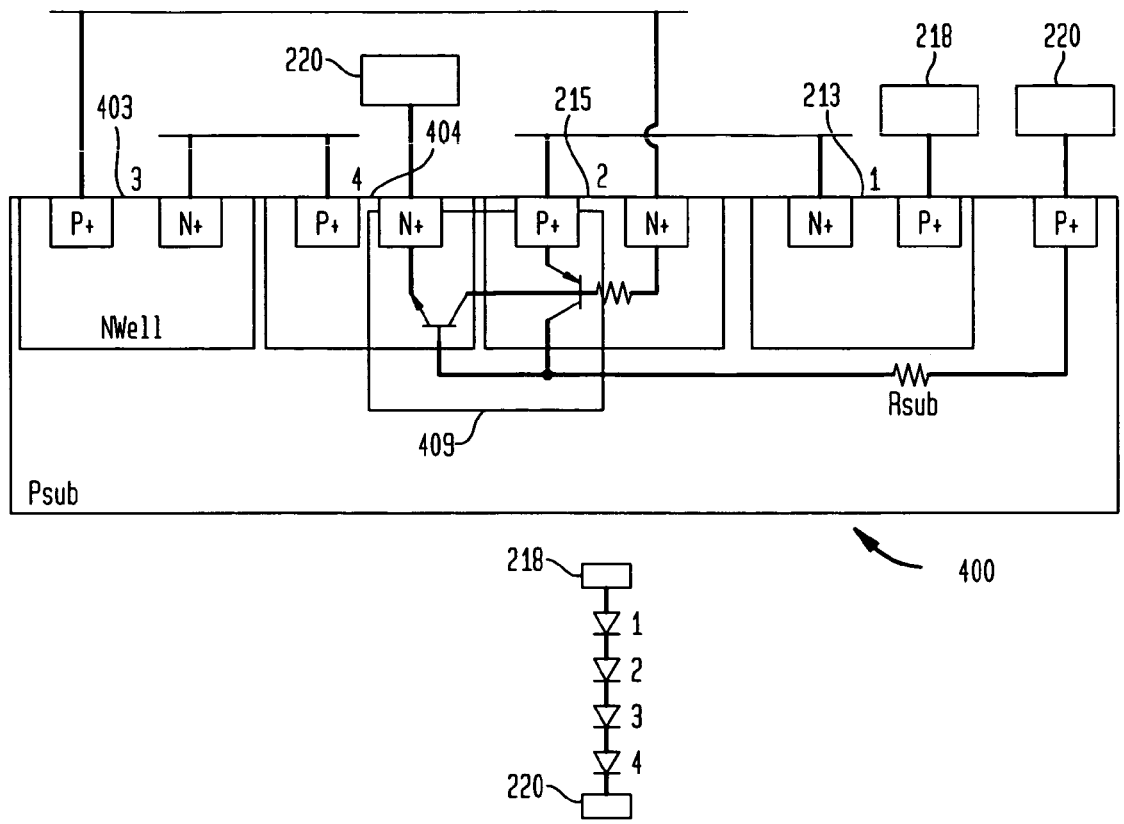
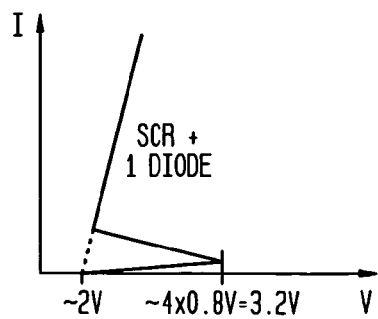
FIG. 5B

FIG. 6
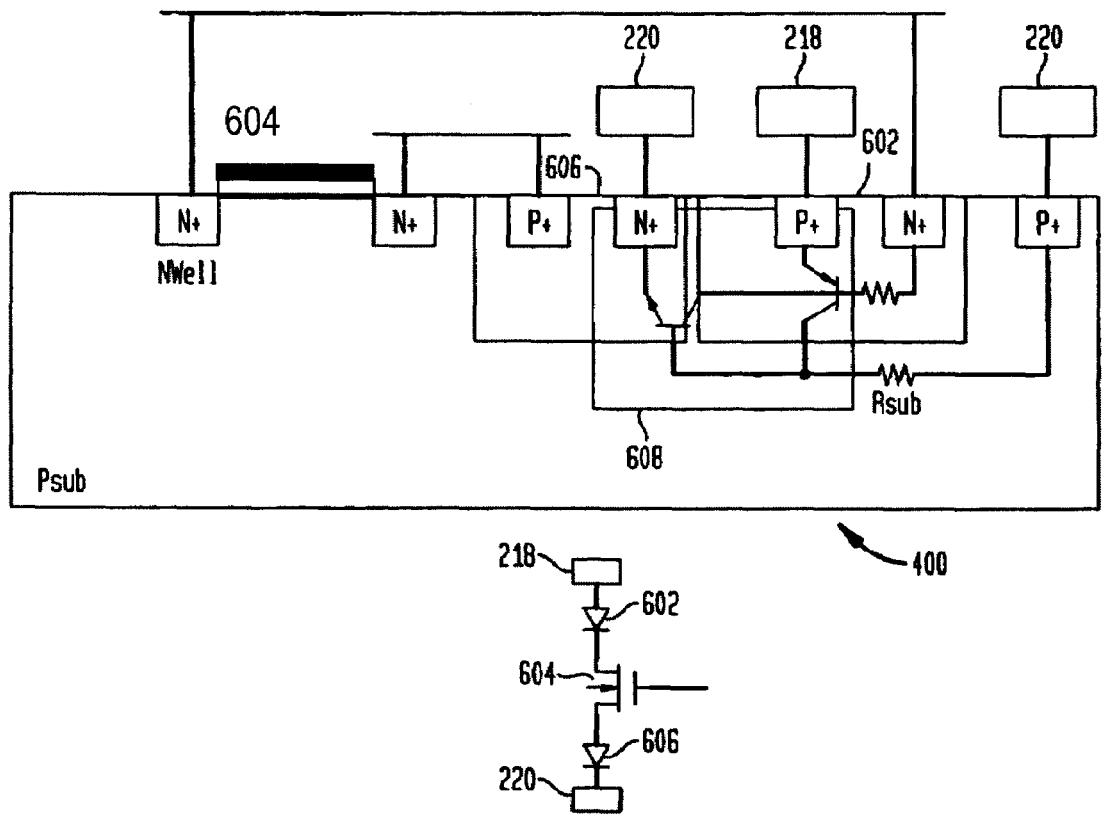
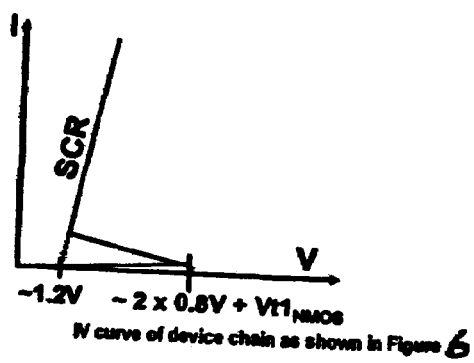
Fig. 7

SEMICONDUCTOR DEVICE BASED ON A SCR

CROSS REFERENCES

This patent application claims the benefit of U.S. Provisional Application Ser. No. 60/666,476 filed Mar. 30, 2005, the contents of which are incorporated by reference herein.

FIELD OF THE INVENTION

This invention generally relates to the field of semiconductor devices and more specifically, improvements of constructing an electrostatic discharge (ESD) protection device structure based on a silicon controlled rectifier (SCR) structure between semiconductor devices.

BACKGROUND OF THE INVENTION

The ongoing advancements in integrated circuit (IC) technologies have led to the use of lower supply voltages to operate the IC's. Lower supply voltages help cope with a problem of hot carrier induced, limited lifetime for the IC's. Designing the IC's with lower supply voltages requires the use of very thin gate oxides. The thickness of the gate oxides influences the amount of drive current that is generated. The thinner the gate oxide layer, the more drive current is generated, which thereby increases the speed of the circuit. The gate oxides (e.g. silicon dioxide) may have a thickness of less than 3 nanometers, and further advancements will allow the gate oxide thickness to scale down even further. The lower supply voltages also allow the use of silicon controller rectifiers (SCRs) with very low holding voltages (e.g. 1.5-2.0V) without introducing a risk of latch-up. The thin gate oxides, which are used in conjunction with low supply voltages, require extreme limitation of transient voltages during an ESD current.

FIG. 1 depicts a schematic diagram of a prior art diode turn-on SCR or diode triggered SCR (DTSCR) protection device 100 to preferably provide ESD protection, as illustratively provided in U.S. Pat. No. 6,786,616 B2. In particular, the DTSCR 100 consists of an NPN transistor with highly doped N+ and P+ regions in lowly doped N-well, forming an anode 102 and an PNP transistor with highly doped N+ and P+ regions in lowly doped P-well or P substrate forming a cathode 104. The anode 102 is connected to a pad (not shown) and to one side of a resistor 106. The resistor 106 presents the resistance of the N-well or an external resistor which is seen at the base of PNP transistor. The cathode 104 is connected to a ground (not shown) and to one side of a resistor 108. The resistor 108 represents the resistance of the P-well or an external resistor which is seen at the base of the NPN transistor. Also included is a first trigger tap or gate G1 110 to the base of NPN and a second trigger tap or gate G2 112 to the base of the PNP. Also included is a string of diode chain 114 connected to the trigger tap G1 110 or to the trigger tap G2 112 as shown in FIG. 1. The diode chain 114 injects current in either the Pwell P+ region, to forward bias G1-Cathode junction or extracts current from the Nwell N+, to forward bias the Anode-G2 junction. This in turn triggers the SCR 100 So, in previous art, a diode chain such as one shown in FIG. 1 is used to trigger an SCR.

In the previous art the diode string is placed and created externally, separate to the SCR. The diode string was optimized for triggering the SCR for the ESD-current capability. Therefore, the diode string will conduct only trigger current and the SCR will only conduct ESD-current.

Therefore, there is a need in the art to provide a novel means for constructing an ESD device with using the advantages of the current capability of the diode string and the trigger capability of the SCR.

SUMMARY OF THE INVENTION

In one embodiment of the present invention, there is provided a semiconductor structure comprising at least two semiconductor devices such that a silicon controlled rectifier (SCR) is formed between the two devices. The structure further comprises a first voltage potential and a second voltage potential coupled to the two devices.

In another embodiment of the present invention, there is provided a semiconductor structure comprising a first lightly doped region of a first conductivity type formed in a second lightly doped region of a second conductivity type. The structure further comprises a third lightly doped region of the first conductivity type formed in the second lightly doped region of the second conductivity type. A first heavily doped region of the second conductivity type is formed in the first lightly doped region and second heavily doped region of the first conductivity type is formed in the third lightly doped region such that an silicon controlled rectifier (SCR) is formed between the first heavily doped region and the third lightly doped region. Furthermore, the first heavily doped region is coupled to a first voltage potential and the third lightly doped region is coupled to a second voltage potential through at least the second heavily doped region.

BRIEF DESCRIPTION OF THE DRAWINGS

FIG. 4B depicts an illustrative cross-section diagram of a semiconductor structure according to an alternate embodiment with reference to FIG. 4A of the present invention.

FIG. 5B depicts a graphical representation of a IV cure of the semiconductor structure depicted in FIG. 4B.

FIG. 6 depicts an illustrative cross-section diagram of a semiconductor structure according to another embodiment of the present invention.

FIG. 7 depicts a graphical representation of a IV cure of the semiconductor structure depicted in FIG. 6.

DETAILED DESCRIPTION OF THE INVENTION

In embodiment of the present invention, there is provided a novel way of constructing a semiconductor device, preferably for ESD protection exhibiting many of the same characteristics as the previous art DTSCR. Some of the these characteristics include a tunable trigger voltage by adjusting the number of diodes used, a tunable holding voltage by adding diodes in series with the SCR anode and a high performance due to the SCR properties. The present invention provides additional design flexibility to create a semiconductor device and furthermore provides also for achieving the triggering of the device without activating a series of diodes or other elements, as will be described in greater detail below. Specifically, the present invention provides a "parasitic" SCR formed between the two devices to improve the ESD performance of the device. Note that from a semiconductor process point of view, any SCR structure is a parasitic device. Looking at the IC products and the semiconductor process used for these products, an SCR is never a standard device, it is always parasitic to the process. In the present application, this parasitic structure is exploited to protect against ESD stress due to its appropriate properties. Anyone skilled in the art will understand that using such dedicated SCR structures for the embodiments in this invention is known.

Figure 1:
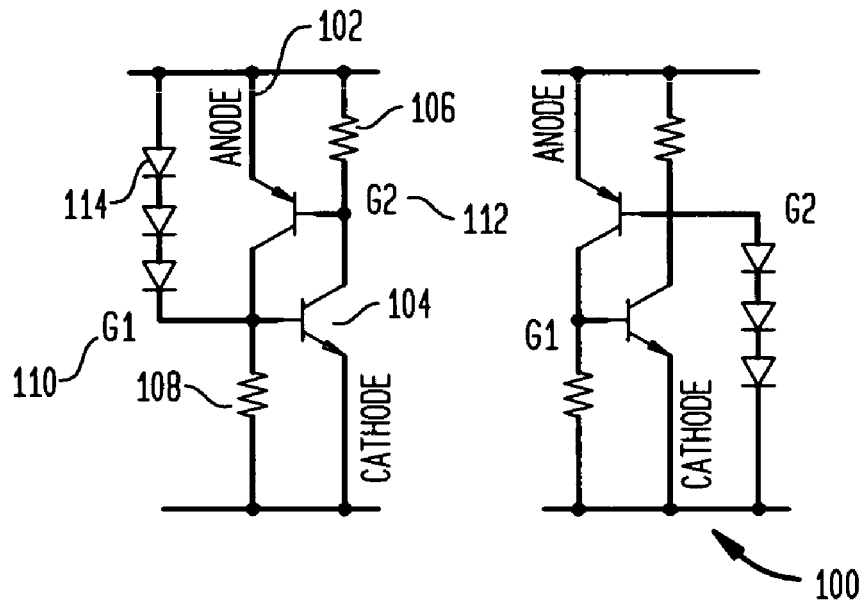
FIG. 1 depicts a schematic diagram of a prior art illustrating a diode triggered silicon controlled rectifier (DTSCR).
Figure 2A:
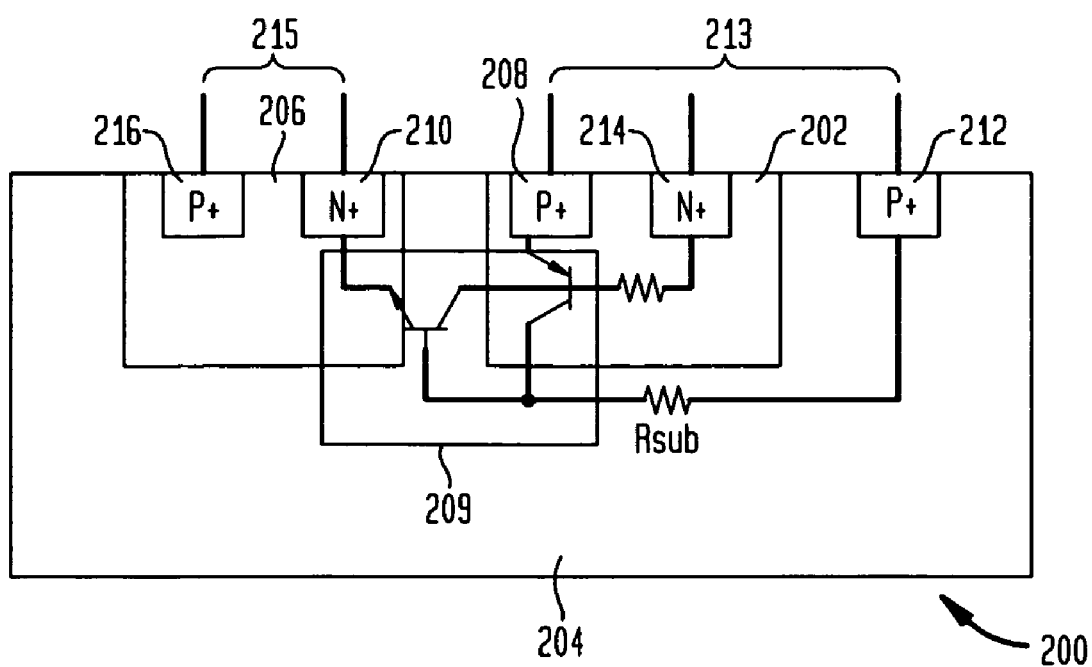
FIG. 2A depicts an illustrative cross-section diagram of a semiconductor structure according to one embodiment of the present invention.

Referring to FIG. 2A, there is shown a generic cross-section diagram of the semiconductor structure 200 according to one embodiment of the present invention. The structure comprises a first lightly doped region (N-well) 202 of a first conductivity type formed in a second lightly doped region (P-substrate) 204 of a second conductivity type. The second conductivity type is opposite to the first conductivity type. The structure 200 further includes a third lightly doped region (N-well) 206 also formed in the second lightly doped region (P-substrate) 204. A first heavily doped region (P+) 208 of the second conductivity type is formed in the first lightly doped region (N-well) 202. A second heavily doped region (N+) 210 of the first conductivity type is formed in the third lightly doped region (N-well) 206. As seen in FIG. 2A, a combination of two bipolar transistors (NPN and the PNP) forms a SCR 209. Also as shown in FIG. 2A, a third heavily doped region (P+) 212 of the second conductivity type is formed in the second lightly doped region (P-substrate) 204. A fourth heavily doped region (N+) 214 of the first conductivity type is formed in the first lightly doped region (N-well) 202. Also, a fifth heavily doped region (P+) 216 of the second conductivity type is formed in the third lightly doped region (N-well) 206. The first heavily doped region (P+) 208 and the fourth heavily doped region (N+) 214 in the first lightly doped region (N-well) 202 form a first device 213, preferably a diode. Also, a second heavily doped region (N+) 210. and the fifth heavily doped region (P+) 216 in the third lightly doped region (N-well) 206 form a second device 215, preferably a diode, as clearly show in FIG. 2A It is to be noted that the devices 213 and 215 are presented as diodes in various embodiments of the present invention, however, one skilled in the art that can appreciate that the devices 213 and 215 may also preferably be a MOS, a resistor, a circuit etc.

Figure 2B:
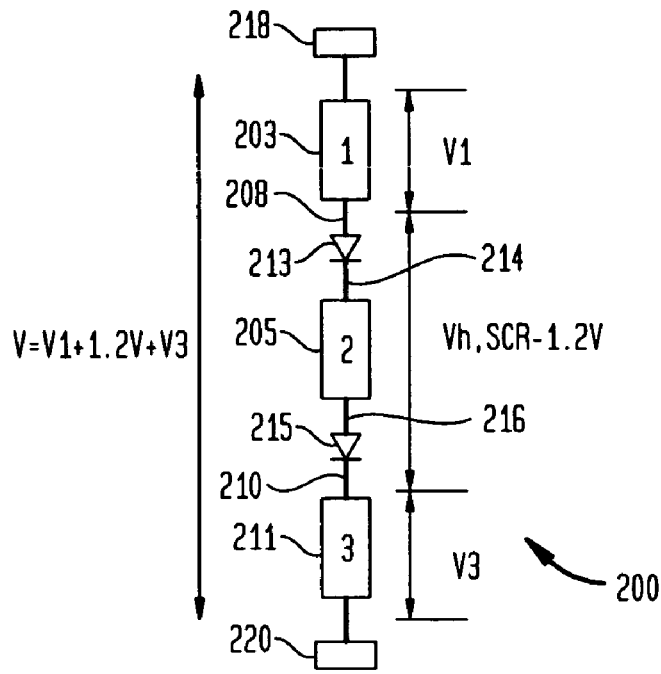
FIG. 2B depicts a schematic diagram of the semiconductor structure with reference to FIG. 2A. of the present invention.

Referring to FIG. 2B , there is illustrated a generic schematic diagram of a semiconductor structure 200 of FIG. 2A. The structure 200 essentially comprises of at least 2 diodes 213 and 215. Diode 213 is coupled to a first potential 218 (preferably a pad to an integrated circuitry) through a device 203 (#1). Diode 215 is coupled to a second potential 220 (preferably a pad to ground) through a device 211 (#3). Additionally, the diode 213 is coupled to diode 215 through a device 205 (#2) as shown in FIG. 2B. Devices 203, 205 and 211 can comprise one of a MOS, diode, resistor, circuit, . . . The structure 200 shows a first device (diode) 213 and a second device (diode) 215 placed in series with three other devices 207, 209 and 211. Although, five devices are shown, it is known that there may preferably include more or less than five devices, however, a minimum of 2 devices is required to form an SCR. As discussed above with reference to FIG. 2A, the first device 213 preferably includes the first diode and the second device 215 preferably includes the second diode. The SCR 209 of FIG. 2A, preferably is an ESD protection device between the node 208' (P+ region 208 of FIG. 2A) and node 210' (N+ region 210 of FIG. 2A) as shown in FIG. 2B.

Figure 2C:
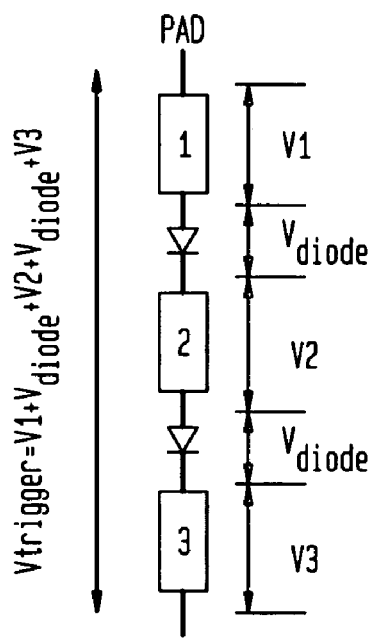
FIG. 2C depicts a schematic diagram of the semiconductor structure with reference to FIG. 2A. of the present invention.

Note that the SCR is the combination of two bipolar transistors as shown in FIG. 2A. So, the SCR 209 clamps the voltage between the first diode 213 and the second diode 215 to the SCR holding voltage, Vh, to approximately 1.2 Volts as shown in FIG. 2B. The trigger voltage (Vtrigger) of the SCR 209 is the combination of the voltages V1, Vdiode 213, V2, Vdiode 215 and V3 as shown in FIG. 2C. V1 is the voltage between the first voltage potential 218 and the device 203. Vdiode 213 is the voltage over the diode 213. V2 is the voltage over the device 205. Vdiode 215 is the voltage over the diode 215. V3 is the voltage between the second voltage potential 220 and the second diode 215. So, now referring back to FIG. 2B, Vh is the holding voltage of the SCR formed between diode 213 and diode 215 and has a value of approximately 1.2 Volts. Therefore, the device 205 represents two things. First, it represents a device to tune the trigger voltage (V) (in combination with devices 203, 211, 213 and 215) of the chain in order to fit the ESD design window. This trigger voltage must be below the maximum voltage of the protected circuit defined by the ESD design window. Second, device 205 can represents a device with only limited current conduction capabilities because the ESD current isn't flowing through this device (circuit) when the SCR is triggered. One possibility is to use an instance of the core or the protected circuit.

Figure 3:
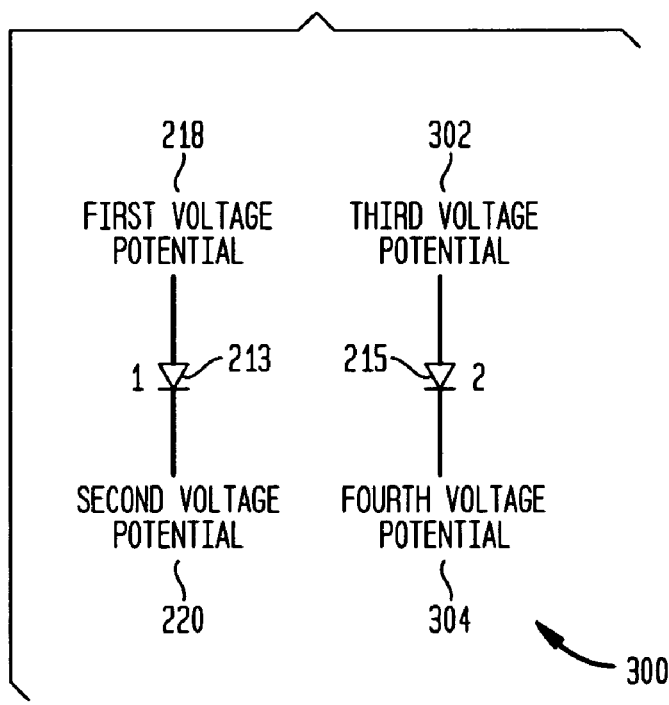
FIG. 3 depicts a schematic diagram of a semiconductor structure according to an alternate embodiment of the present invention.

FIG. 3 illustrates a generic schematic diagram of a semiconductor structure 300 of another embodiment of the present invention. In this embodiment, the two devices (diodes) 202 and 204 of FIG. 2, between which the SCR exists, do not have to be placed in series. This is shown in FIG. 3. In this case scenario, the first device, i.e. diode 213 is coupled between the first voltage potential 218 and the second voltage potential 220 The second device, i.e. diode 215 is coupled between a third voltage potential 302 (preferably a pad connected to an integrated circuitry no shown) and a fourth voltage potential 304) (preferably a ground). As a current (not shown) flows between reference nodes 301 and 302 the PNP of diode 213 (in case of an N-well diode) injects current into the substrate. By placing diode 215 in close proximity of diode 215, they form a SCR, which will clamp the voltage between reference node 301 and reference node 303 to the SCR holding voltage, i.e. ~1.2V. The distance between the two diodes 213 and 215 is essentially the base length of the NPN of the SCR, and is therefore an important design parameter. This concept will create a protection device (in this case an scr) between different nodes. For example, an SCR can be formed between the first voltage potential 218 and the fourth voltage potential 304 and similarly, an SCR can be formed between the third 302 and second voltage potential 220 One possible implementation of the SCRs formed is described in greater detail below with reference to FIG. 8A and FIG. 8B. One skilled in the art can adapt these implementation to create other scr's. Even though, not shown, anyone skilled in the art will recognize that the above embodiment of the invention can easily be applied to (isolated) P-well diodes.

Figure 4A:
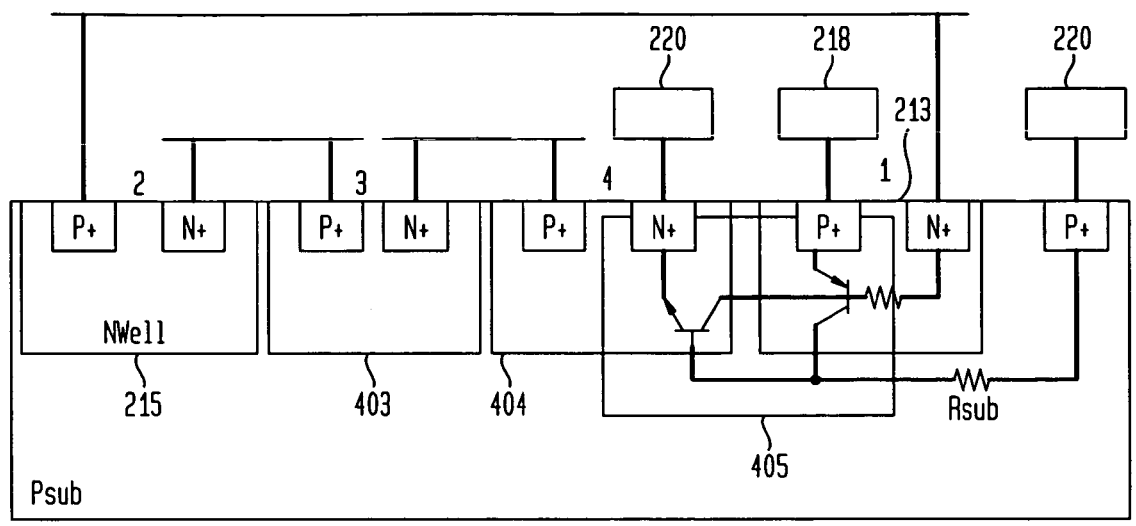
FIG. 4A depicts an illustrative cross-section diagram of a semiconductor structure according to another embodiment of the present invention.
Figure 4A:
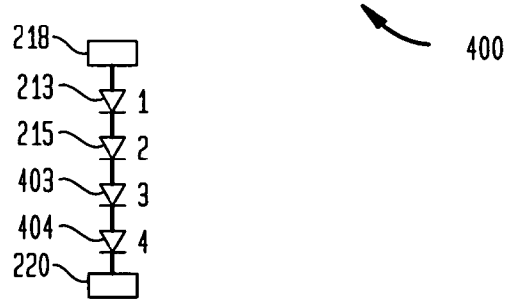
Figure 5A:
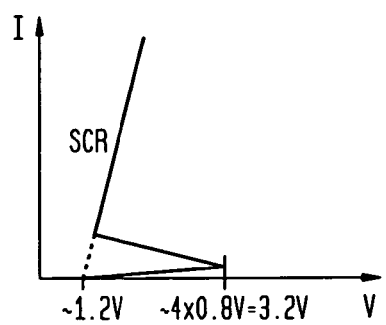
FIG. 5A depicts a graphical representation of a IV curve of the semiconductor structure depicted in FIG. 4A.

Referring to FIG. 4A there is shown an implementation of a semiconductor structure 400 in an another embodiment of the present invention. As shown in FIG. 4A, the structure 400 is similar to structure 200 including the first diode 213 and the second diode 215, however, includes two additional diodes, third diode 403 and fourth diode 404. So, the structure 400 utilizes a string of at least four diodes to trigger the SCR as will be described herewith. Here, a diode chain of four is placed in such a way that the diode to the highest potential is placed next to the diode to the lowest potential. In, other words, the first diode 213 coupled to the first voltage potential 218 is placed next to the fourth diode 404 coupled to the second voltage potential 220 as shown in FIG. 4A. As seen in FIG. 4A, a SCR 405 is formed with the combination of the two bipolar transistors. The SCR 405 will trigger after that the diode chain starts to conduct current. It is to be noted that on the right side of FIG. 4A is shown a schematics of the diodes without the SCR. Also, note that the order of the highly doped P+ and N+ junctions inside the diodes can be chosen such that the anode and the cathode are closest to each other. The IV (current/voltage) curve of this structure 400 of FIG. 4A is shown in a graphical presentation in FIG. 5A. In FIG. 5A the electrical behavior of the structure of FIG. 4A is shown. On the IV-curve, the trigger voltage of approximate 3.2V and the holding voltage of approximate 1.2V is shown. The circuit of FIG. 4A starts to conduct current if the four diode are forward biased. In a normal case is this if the voltage over each diode is approximate 0.8 V. The SCR 405 will trigger if the voltage reach the 3.2V. After triggering the SCR 405 will be clamped to his holding voltage of approximate 1.2V.

Referring to FIG. 4B, there is shown a cross-section diagram of a semiconductor structure according to an another embodiment of the present invention. It is to be noted that the left of FIG. 4B shows the cross-section with the SCR and on the right is the schematic shown without the SCR. As shown in FIG. 4B, the order of the diodes is slightly changed as compared to FIG. 4A with the SCR 409 formed as shown in FIG. 4B. e. This change of arrangement in the order of diodes is to have a diode in series with the SCR 409 as shown in FIG. 4B. This pushes the holding voltage up to ~1.2V+0.8V, as shown in FIG. 5B. In FIG. 5B is the IV curve shown of the device. As seen has this device as in FIG. 5A the same trigger voltage 3.2V of 4 diodes in series. The holding voltage is increased with 0.8 V through the place of one of the diodes in series with the two diodes where the SCR 409 is formed between. This diode will also conduct the ESD current.

Figure 4C:
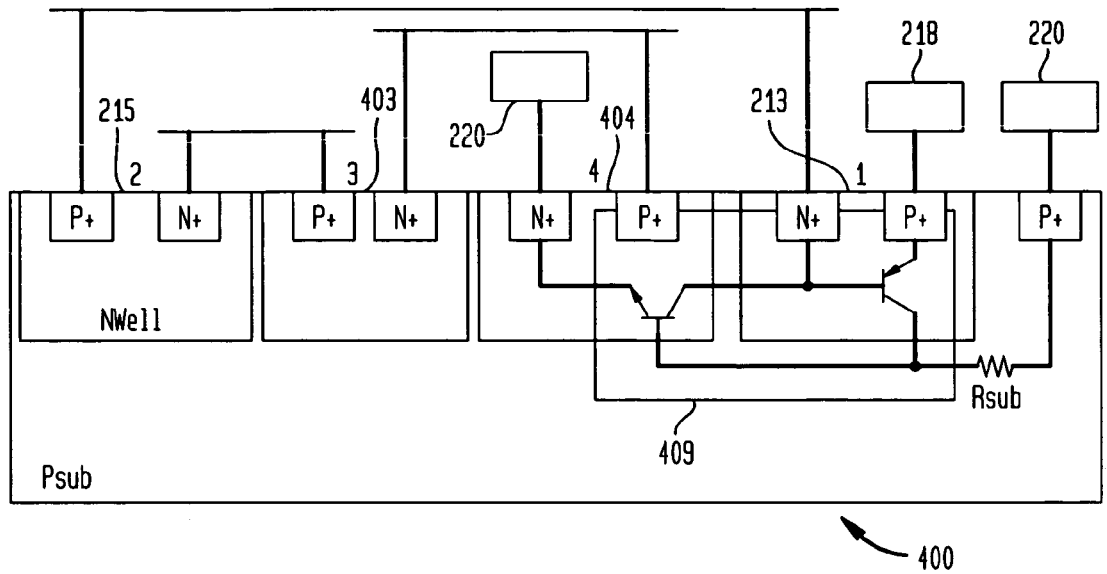
FIG. 4C depicts an illustrative cross-section diagram of a semiconductor structure according to another alternate embodiment with reference to FIG. 4A of the present invention.
Figure 4D:
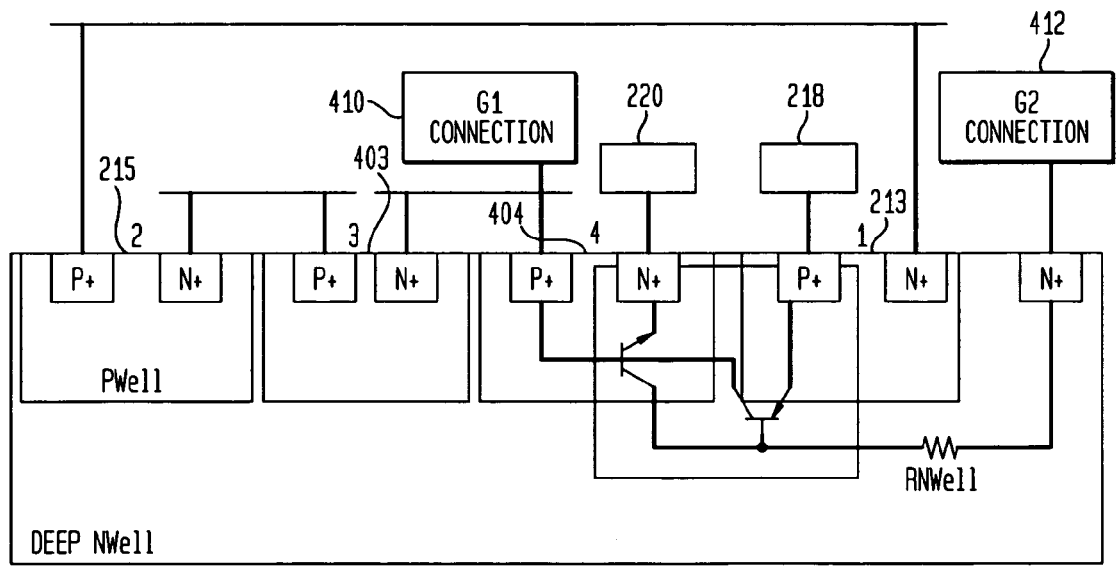
FIG. 4D depicts an illustrative cross-section diagram of a semiconductor structure according to another alternate embodiment with reference to FIG. 4A of the present invention.

Alternatively, the P+ and N+ regions of FIG. 4A can be reversed to obtain a higher holding voltage as shown in FIG. 4C as an alternate embodiment of the present invention. In FIG. 4C, the order of P+ and N+ in the first diode 213 and the fourth diode 404 respectively are reversed in order to increase the anode-cathode spacing of the SCR 409, thereby increasing the SCR holding voltage. Another embodiment of present invention includes an alternate implementation of FIG. 4A as provided in FIG. 4D. In FIG. 4D, isolated Pwell diodes are used to achieve the same IV curve as depicted in FIG. 5A. The number of diodes in the diode chain is determined by circuit characteristics; however, for the invention to work, two diodes suffice. Please note that when multiple diodes are placed in series, multiple SCRs exist. Careful design is necessary to be able to predict which SCR will trigger. Another embodiment of present invention includes an connection to the diodes: G1 connection 410 and G2 connection 412. An external on-chip device can be connected to one of the two connections 410 and 412 to supply an additional trigger current.

Figure 8A:
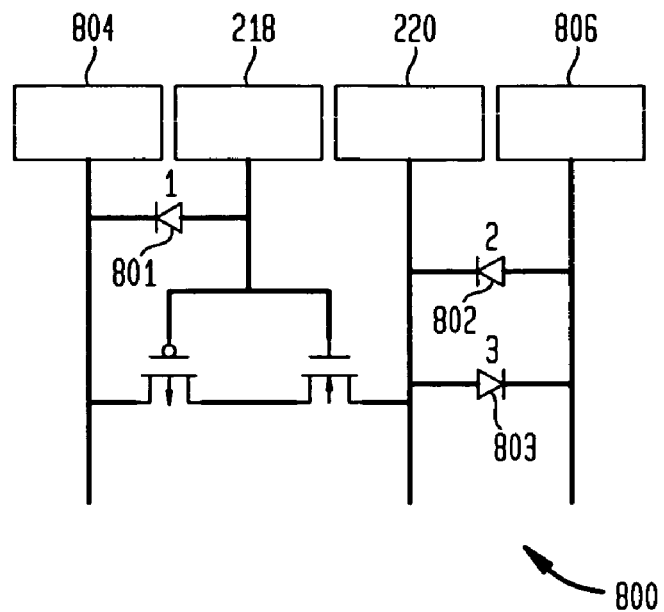
FIG. 8A depicts a schematic diagram of a semiconductor structure according to another alternate embodiment of the present invention.
Figure 8B:
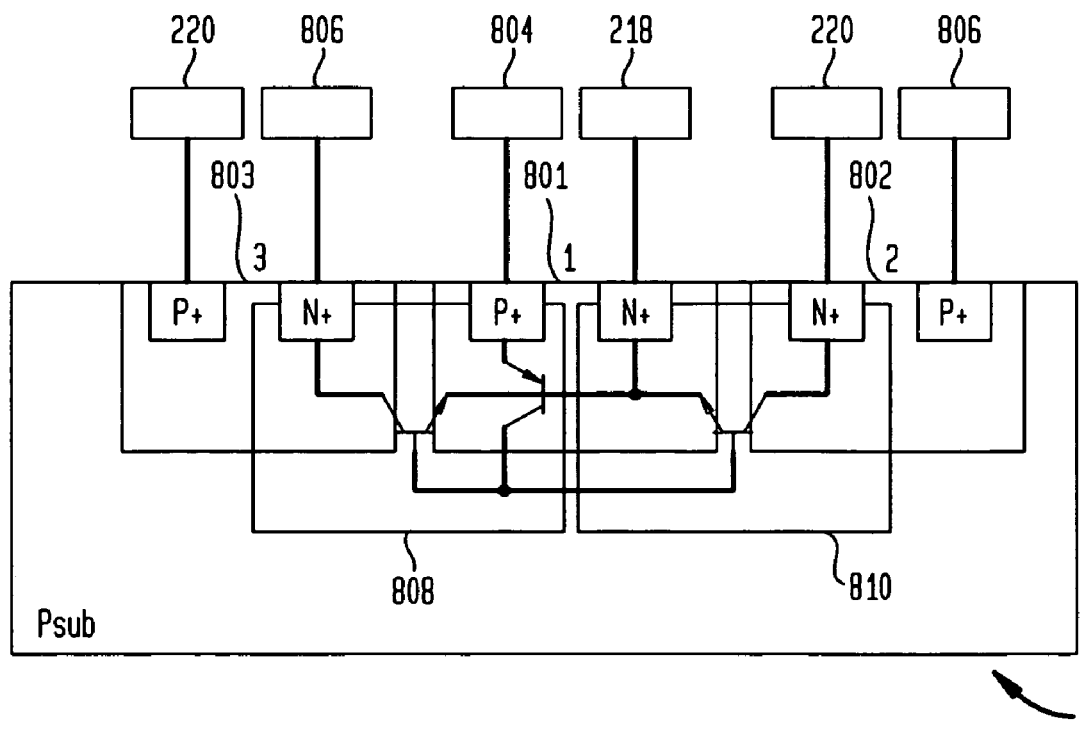
FIG. 8B depicts an illustrative cross-section diagram of the semiconductor structure with reference to FIG. 8A of the present invention.

It is to be noted that any chain of devices, which consists of at least two diodes, can be used to create the SCR. This is represented in a cross-section diagram of a semiconductor structure 600 of FIG. 6 in another embodiment of the present invention. It is to be noted that the left of FIG. 6 shows the cross-section with the SCR and on the right is the schematic shown without the SCR. As shown in FIG. 6, a device 602 (diode), a device 604 (NMOS) and another device 606 (diode) are placed in series It is to be noted that the devices 602 and 606 are presented as diodes and device 604 is presented as NMOS in this embodiments of the present invention, however, one skilled in the art that can appreciate that the devices 602, and 606 can also preferably be a MOS, a resistor, a circuit etc and device 604 can also preferably be a diode, a resistor, a circuit etc. This chain of diode 602, NMOS 604 and diode 606 create an SCR 608. The SCR 608 is formed with the combination of n the two diodes 602 and 606 and the NMOS 604. The first diode 602 and the second diode 606 are coupled together with an NMOS 604 which acts as a triggering device, triggering the SCR 608. The SCR 608 triggers as soon as sufficient current flows through the devices of the chain. The SCR 608 can be triggered at Vtlnmos+2×0.8V as shown in the IV (current/voltage) curve of this structure 600 of FIG. 6 in a graphical presentation in FIG. 7. Again, by placing two diodes, 602 and 606 close together, the voltage is clamped to 1.2V. As discussed above, a possible implementation of structure 300 in FIG. 3 is shown as a semiconductor 800 in a schematic diagram and a cross-section diagram of FIG. 8A and FIG. 8B respectively, In the structure 800, the two devices, preferably diodes, constructing the SCR are not placed in series. The two devices constructing the SCR include diode 801 and diode 802. Another two devices constructing another SCR include diode 801 and diode 803. It is to be noted that the devices 801 and 802 are presented as diodes in this embodiment of the present invention, however, one skilled in the art that can appreciate that the devices 801, and 802 can also preferably be a MOS, a resistor, a circuit etc. The FIG. 8A depicts an input stage with a diode 801 coupled to a first voltage potential 218 and a fourth voltage potential 804 Diodes 802 and diode 803 are coupled to second voltage potential 220 and to a third voltage potential 806. As is common practice in real IC's, the two ground busses 220 and 806 are connected with anti-parallel diodes, i.e. diode 802 and diode 803 as shown in FIG. 8A and FIG. 8B. It is to be noted that no functional SCR exists between the diodes 802 and 803, since the anode and cathode is these SCRs are connected to the same node, i.e. either second voltage potential 220 or the third voltage potential 806.

Referring back to FIG. 8A and FIG. 8B, two functional SCRs exists. A first SCR 808 exists between diode 801 and diode 802 providing ESD protection between the first voltage potential 218 and the second voltage potential 220 as shown in FIG. 8B. Another SCR 810 exists between diode 801 and diode 803, providing ESD protection between the first voltage potential 218 and the fourth voltage potential 806. Although this has the advantage that there is a direct protection to both second and the fourth voltage potentials 220 and 806, i.e. ground busses, without adding additional area or capacitance to the first voltage potential 218. Note that even though two SCRs, are shown in FIG. 8A and FIG. 8B, the invention is also applicable if only one of the two SCR is exploited.

Although various embodiments that incorporate the teachings of the present invention have been shown and described in detail herein, those skilled in the art can readily devise many other varied embodiments that still incorporate these teachings without departing from the spirit and the scope of the invention.

What is claimed is:

1. A semiconductor circuit comprising:
   at least two semiconductor devices, wherein a silicon controlled rectifier is formed between the at least two semiconductor devices, said at least two semiconductor devices are coupled together with at least one coupling device, wherein said at least one coupling device is not part of the silicon controlled rectifier;
   at least a first voltage potential and at least a second voltage potential coupled to the two devices.

2. The structure of claim 1 wherein said devices are at least one of a diode, a MOS, a resistor, a capacitor, a inductor.

3. The structure of claim 1 wherein said devices are coupled in series.

4. The structure of claim 1 wherein said first device is coupled to the first potential and the second device is coupled to the second potential.

5. The structure of claim 1 wherein said first device is coupled between the first potential and the second potential.

6. The structure of claim 5 further comprising a third potential and a fourth potential, wherein said second device is coupled between the third potential and the fourth potential.

7. The structure of claim 1 wherein said coupling device controls the trigger voltage of the silicon controlled rectifier.

8. A semiconductor structure comprising:
   a first lightly doped region of a first conductivity type formed in a second lightly doped region of a second conductivity type
   a third lightly doped region of the first conductivity type formed in the second lightly doped region of the second conductivity type;
   a first heavily doped region of the second conductivity type and a fourth heavily doped region of the first conductivity type formed in the first lightly doped region, a second heavily doped region of the first conductivity type and a fifth heavily doped region of the second conductivity type formed in the third lightly doped region; wherein an SCR is formed between the first heavily doped region and the third lightly doped region, said first heavily doped region is coupled to a first voltage potential and said third lightly doped region is coupled to a second voltage potential, said first and fourth heavily doped region form a first semiconductor device and said second and fifth heavily doped region form a second semiconductor device, wherein said first semiconductor device and said second semiconductor device are coupled together with at least one coupling device, said at least one coupling device is not part of the SCR.

9. The structure of claim 8 further comprising:
   a third heavily doped region of the second conductivity type formed in the second lightly doped region.

10. The structure of claim 8 wherein said first semiconductor device is a first diode and said second semiconductor device is a second diode.

11. The structure of claim 10 wherein the first diode is coupled to a first potential and the second diode is coupled to a second potential.

12. The structure of claim 11 wherein said first diode and the second diode form an SCR as an ESD protection circuit between the first and the second potential.

13. The structure of claim 11 wherein the first diode is coupled to the first potential by a at least one diode.

14. The structure of claim 11 wherein the first and the second diodes are coupled together through at least one trigger device.

15. The structure of claim 14 wherein the trigger device comprise at least one of a MOS, a diode, a capacitor, an inductor, and a resistor.

16. The structure of claim 10 wherein said first diode is coupled between the first potential and the second potential.

17. The structure of claim 10 further comprising a third potential and a fourth potential, wherein said second element is coupled between the third potential and the fourth potential.

18. The structure of claim 8 wherein said coupling device controls the trigger voltage of the silicon controlled rectifier.

* * * * *